United States Patent
Li

(10) Patent No.: US 8,637,357 B2
(45) Date of Patent: Jan. 28, 2014

(54) CMOS TRANSISTOR WITH DUAL HIGH-K GATE DIELECTRIC AND METHOD OF MANUFACTURE THEREOF

(75) Inventor: Hong-Jyh Li, Austin, TX (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/444,752

(22) Filed: Apr. 11, 2012

(65) Prior Publication Data

US 2012/0193725 A1 Aug. 2, 2012

Related U.S. Application Data

(62) Division of application No. 10/870,616, filed on Jun. 17, 2004, now Pat. No. 8,178,902.

(51) Int. Cl.
*H01L 21/00* (2006.01)
*H01L 21/84* (2006.01)

(52) U.S. Cl.
USPC .................. 438/153; 438/154; 438/199

(58) Field of Classification Search
USPC .................................. 438/153, 154
See application file for complete search history.

(56) References Cited

U.S. PATENT DOCUMENTS

| | | | |
|---|---|---|---|
| 4,432,035 A | 2/1984 | Hsieh et al. |
| 4,990,974 A | 2/1991 | Vinal |
| 5,041,885 A | 8/1991 | Gualandris et al. |
| 5,053,349 A | 10/1991 | Matsuoka |
| 5,066,995 A | 11/1991 | Young et al. |
| 5,108,935 A | 4/1992 | Rodder |
| 5,162,263 A | 11/1992 | Kunishima et al. |
| 5,321,287 A | 6/1994 | Uemura et al. |
| 5,352,631 A | 10/1994 | Sitaram et al. |
| 5,763,922 A | 6/1998 | Chau |
| 5,780,330 A | 7/1998 | Choi |
| 5,994,747 A | 11/1999 | Wu |
| 6,020,243 A | 2/2000 | Wallace et al. |
| 6,027,961 A | 2/2000 | Maiti et al. |

(Continued)

FOREIGN PATENT DOCUMENTS

| | | |
|---|---|---|
| EP | 1298722 A2 | 4/2003 |
| EP | 1388889 A2 | 2/2004 |

(Continued)

OTHER PUBLICATIONS

Aoyama, T., et al., "Proposal of New HfSiON CMOS Fabrication Process (HAMDAMA) for Low Standby Power Device," IEEE International Electron Devices Meeting, Dec. 13-15, 2004, pp. 95-98.

(Continued)

*Primary Examiner* — Thien F Tran
(74) *Attorney, Agent, or Firm* — Slater & Matsil, L.L.P.

(57) ABSTRACT

A CMOS device with transistors having different gate dielectric materials and a method of manufacture thereof. A CMOS device is formed on a workpiece having a first region and a second region. A first gate dielectric material is deposited over the second region. A first gate material is deposited over the first gate dielectric material. A second gate dielectric material comprising a different material than the first gate dielectric material is deposited over the first region of the workpiece. A second gate material is deposited over the second gate dielectric material. The first gate material, the first gate dielectric material, the second gate material, and the second gate dielectric material are then patterned to form a CMOS device having a symmetric $V_t$ for the PMOS and NMOS FETs.

27 Claims, 9 Drawing Sheets

(56) References Cited

U.S. PATENT DOCUMENTS

| | | |
|---|---|---|
| 6,033,944 A | 3/2000 | Shida |
| 6,048,769 A | 4/2000 | Chau |
| 6,084,280 A | 7/2000 | Gardner et al. |
| 6,124,171 A | 9/2000 | Arghavani et al. |
| 6,159,782 A | 12/2000 | Xiang et al. |
| 6,159,810 A | 12/2000 | Yang |
| 6,171,910 B1 | 1/2001 | Hobbs et al. |
| 6,184,072 B1 | 2/2001 | Kaushik et al. |
| 6,225,163 B1 | 5/2001 | Bergemont |
| 6,291,867 B1 | 9/2001 | Wallace et al. |
| 6,337,248 B1 | 1/2002 | Imai |
| 6,348,390 B1 | 2/2002 | Wu |
| 6,373,111 B1 | 4/2002 | Zheng et al. |
| 6,410,967 B1 | 6/2002 | Hause et al. |
| 6,426,534 B1 | 7/2002 | Look et al. |
| 6,444,555 B2 | 9/2002 | Ibok |
| 6,448,127 B1 | 9/2002 | Xiang et al. |
| 6,475,908 B1 | 11/2002 | Lin et al. |
| 6,492,217 B1 | 12/2002 | Bai et al. |
| 6,528,858 B1 | 3/2003 | Yu et al. |
| 6,563,178 B2 | 5/2003 | Moriwaki et al. |
| 6,563,183 B1 | 5/2003 | En et al. |
| 6,586,296 B1 | 7/2003 | Watt |
| 6,621,114 B1 | 9/2003 | Kim et al. |
| 6,656,764 B1 | 12/2003 | Wang et al. |
| 6,693,333 B1 | 2/2004 | Yu |
| 6,716,685 B2 | 4/2004 | Lahaug |
| 6,720,221 B1 | 4/2004 | Ahn et al. |
| 6,737,313 B1 | 5/2004 | Marsh et al. |
| 6,740,944 B1 | 5/2004 | McElheny et al. |
| 6,747,318 B1 | 6/2004 | Kapre et al. |
| 6,763,822 B1 | 7/2004 | Styles |
| 6,812,542 B2 | 11/2004 | Kohyama |
| 6,852,645 B2 | 2/2005 | Colombo et al. |
| 6,855,605 B2 | 2/2005 | Jurczak et al. |
| 6,873,003 B2 | 3/2005 | Casarotto et al. |
| 6,890,807 B2 | 5/2005 | Chau et al. |
| 6,897,095 B1 | 5/2005 | Adetutu et al. |
| 6,921,691 B1 | 7/2005 | Li et al. |
| 6,936,882 B1 | 8/2005 | Ahmed et al. |
| 7,060,568 B2 | 6/2006 | Metz et al. |
| 7,091,568 B2 | 8/2006 | Hegde et al. |
| 7,348,284 B2 | 3/2008 | Doyle et al. |
| 7,361,958 B2 | 4/2008 | Brask et al. |
| 2001/0012653 A1 | 8/2001 | Tsukamoto |
| 2002/0005556 A1 | 1/2002 | Cartier et al. |
| 2002/0053711 A1 | 5/2002 | Chau et al. |
| 2002/0090773 A1 | 7/2002 | Bojarczuk, Jr. et al. |
| 2002/0098649 A1 | 7/2002 | Chien et al. |
| 2002/0135030 A1 | 9/2002 | Horikawa |
| 2002/0135048 A1 | 9/2002 | Ahn et al. |
| 2002/0151125 A1 | 10/2002 | Kim et al. |
| 2002/0153573 A1 | 10/2002 | Mogami |
| 2003/0057432 A1 | 3/2003 | Gardner et al. |
| 2003/0099766 A1 | 5/2003 | Jurczak et al. |
| 2003/0104663 A1 | 6/2003 | Visokay et al. |
| 2003/0116804 A1 | 6/2003 | Visokay et al. |
| 2003/0119292 A1 | 6/2003 | Lee et al. |
| 2003/0137017 A1 | 7/2003 | Hisamoto et al. |
| 2003/0141560 A1 | 7/2003 | Sun |
| 2003/0151560 A1 | 8/2003 | Kienzle et al. |
| 2003/0203560 A1 | 10/2003 | Ryu et al. |
| 2003/0219953 A1 | 11/2003 | Mayuzumi |
| 2004/0000695 A1 | 1/2004 | Matsuo |
| 2004/0005749 A1 | 1/2004 | Choi et al. |
| 2004/0009675 A1 | 1/2004 | Eissa et al. |
| 2004/0023462 A1 | 2/2004 | Rotondaro et al. |
| 2004/0094758 A1 | 5/2004 | Usuda et al. |
| 2004/0113211 A1 | 6/2004 | Hung et al. |
| 2004/0132271 A1 | 7/2004 | Ang et al. |
| 2004/0171222 A1 | 9/2004 | Gao et al. |
| 2004/0180487 A1 | 9/2004 | Eppich et al. |
| 2004/0217429 A1 | 11/2004 | Lin et al. |
| 2004/0242021 A1 | 12/2004 | Kraus et al. |
| 2005/0035345 A1 | 2/2005 | Lin et al. |
| 2005/0064663 A1 | 3/2005 | Saito |
| 2005/0098839 A1 | 5/2005 | Lee et al. |
| 2005/0101159 A1 | 5/2005 | Droopad |
| 2005/0139926 A1 | 6/2005 | Shimizu et al. |
| 2005/0224897 A1 | 10/2005 | Chen et al. |
| 2005/0245019 A1 | 11/2005 | Luo et al. |
| 2005/0280104 A1 | 12/2005 | Li |
| 2006/0003507 A1 | 1/2006 | Jung et al. |
| 2006/0017112 A1 | 1/2006 | Wang et al. |
| 2006/0038236 A1 | 2/2006 | Yamamoto |
| 2006/0118879 A1 | 6/2006 | Li |
| 2006/0125018 A1 | 6/2006 | Lee et al. |
| 2006/0131652 A1 | 6/2006 | Li |
| 2006/0141729 A1 | 6/2006 | Wang et al. |
| 2006/0211195 A1 | 9/2006 | Luan |
| 2006/0223335 A1 | 10/2006 | Mathew et al. |
| 2006/0275976 A1 | 12/2006 | Wang |
| 2006/0292773 A1 | 12/2006 | Goolsby et al. |
| 2007/0018245 A1 | 1/2007 | Jeng |
| 2007/0020903 A1 | 1/2007 | Takehara et al. |
| 2007/0034945 A1 | 2/2007 | Bohr et al. |
| 2008/0191286 A1 | 8/2008 | Chang et al. |

FOREIGN PATENT DOCUMENTS

| | | |
|---|---|---|
| EP | 1531496 A2 | 5/2005 |
| JP | 2000-031296 A | 1/2000 |
| JP | 2000-058668 A | 2/2000 |
| JP | 2001-217321 A | 8/2001 |
| JP | 2002-118175 A | 4/2002 |
| JP | 2002-151598 A | 5/2002 |
| JP | 2003-273350 A | 9/2003 |
| JP | 2004-221596 A | 8/2004 |
| JP | 2004-260165 A | 9/2004 |
| JP | 2004-289061 A | 10/2004 |
| JP | 2004-356472 A | 12/2004 |
| JP | 2005-268553 A | 9/2005 |
| WO | WO 01/66832 A2 | 9/2001 |
| WO | WO 2004/095556 A1 | 11/2004 |
| WO | WO 2005/114718 A1 | 12/2005 |
| WO | WO 2006/061371 A1 | 6/2006 |
| WO | WO 2006/067107 A1 | 6/2006 |

OTHER PUBLICATIONS

Cho, Byung-Jin, "HfSi Gate Electrode With Tunable Work Function for Advanced CMOS Devices," National University of Singapore Engineering Research, vol. 19, No. 2, Jun. 2004, 2 pages.

Choi, K., et al., "Growth Mechanism of TiN Film on Dielectric Films and the Effects on the Work Function," Thin Solid Films, vol. 486, Issues 1-2, Aug. 22, 2005, pp. 141-144.

"Front End Processes," International Technology Roadmap for Semiconductors (ITRS), 2002 ITRS Update, http://www.itrs.net/Links/2002Update/2002Update_FEP.pdf, 2002, pp. 45-62.

"Front End Processes," International Technology Roadmap for Semiconductors (ITRS), 2003 Edition, http://www.itrs.net/Links/2003ITRS/FEP2003.pdf, 2003, pp. 23-25.

Gannavaram, Shyam, et al., "Low Temperature ($\leq 800°$ C.) Recessed Junction Selective Silicon-Germanium Source/Drain Technology for sub-70nm CMOS," IEEE International Electron Devices Meeting, 2000, pp. 437-440.

Gao, Wei, et al., "Stacked Metal Layers as Gates for MOSFET Threshold Voltage Control," Mat. Res. Soc. Symp. Proc., vol. 765, 2003, pp. 3-8.

Guha, S., et al., "Atomic Beam Deposition of Lanthanum- and Yttrium-Based Oxide Thin Films for Gate Dielectrics," Applied Physics Letters, vol. 77, No. 17, Oct. 23, 2000, pp. 2710-2712.

Ha, Daewon, "Molybdenum-Gate $HfO_2$ CMOS FinFET Technology," IEEE International Electron Devices Meeting, Dec. 13-15, 2004, pp. 643-646.

"High K Dielectric Materials", Tutorial Materials for Thin Films / Microelectronics, Sigma-Aldrich, http://www.sigmaaldrich.com/Area_of_Interest/Organic_Inorganic_Chemistry/Materials_Science/Thin_Films_Microelectronics/Tutorial/Dielectric_Materials.html, printed on Jun. 9, 2004, 3 pages.

(56) References Cited

OTHER PUBLICATIONS

Hobbs, C., et al., "Fermi Level Pinning at the PolySi/Metal Oxide Interface," Symposium on VLSI Technology Digest of Technical Papers, 2003, pp. 9-10.

Hobbs, Christopher C., et al., "Fermi-Level Pinning at the Polysilicon/Metal Oxide Interface—Part I," IEEE Transactions on Electron Devices, vol. 51, No. 6, Jun. 2004, pp. 971-977.

Huang, Feng-Jung, et al., "Schottky-Clamped NMOS Transistors Implemented in a Conventional 0.8-μm CMOS Process," IEEE Electron Device Letters, vol. 19, No. 9, Sep. 1998, pp. 326-328.

Kedzierski, Jakub, et al., "Fabrication of Metal Gated FinFETs Through Complete Gate Silicidation with Ni," IEEE Transactions on Electron Devices, vol. 51, No. 12, Dec. 2004, pp. 2115-2120.

Kedzierski, Jakub, et al., "Metal-Gate FinFET and Fully-Depleted SOI Devices Using Total Gate Silicidation," International Electron Devices Meeting, 2002, pp. 247-250.

Li, Hong-Jyh, et al., "Dual High-K Gate Dielectric with Poly Gate Electrode: HfSiON on nMOS and $Al_2O_3$ Capping Layer on pMOS," IEEE Electron Device Letters, vol. 26, No. 7, Jul. 2005, pp. 441-444.

Li, Tzung-Lin, et al., "Continuous and Precise Work Function Adjustment for Integratable Dual Metal Gate CMOS Technology Using Hf-Mo Binary Alloys," IEEE Transactions on Electronic Devices, vol. 52, No. 6, Jun. 2005, pp. 1172-1179.

Lin, Ronald, et al., "An Adjustable Work Function Technology Using Mo Gate for CMOS Devices," IEEE Electron Device Letters, vol. 23, No. 1, Jan. 2002, pp. 49-51.

Muller, Richard S., et al., "Device Electronics for Integrated Circuits," Second Edition, John Wiley & Sons, 1986, pp. 380-385 and 398-399.

Park, D.G., et al., "Thermally Robust Dual-Work Function ALD-$MN_x$ MOSFETs Using Conventional CMOS Process Flow," Symposium on VLSI Technology Digest of Technical Papers, 2004, pp. 186-187.

Polishchuk, Igor, et al., "Dual Work Function Metal Gate CMOS Transistors Fabricated by Ni-Ti Interdiffusion," Conf. Symp. Proc, Berkeley Electrical Engineering and Computer Sciences, Feb. 7, 2005, pp. 411-414.

Polishchuk, Igor, et al., "Polycrystalline Silicon/Metal Stacked Gate for Threshold Voltage Control in Metal—Oxide—Semiconductor Field-Effect Transistors," Applied Physics Letters, vol. 76, No. 14, Apr. 3, 2000, pp. 1938-1940.

Samavedam, S.B., et al., "Dual-Metal Gate CMOS with $HfO_2$ Gate Dielectric," IEEE International Electron Devices Meeting, Dec. 8-11, 2002, pp. 433-436.

Samavedam, S.B., et al., "Evaluation of Candidate Metals for Dual-Metal Gate CMOS with $HfO_2$ Gate Dielectric," Mat. Res. Soc. Symp. Proc., vol. 716, 2002, pp. 85-90.

Samavedam, S.B., et al., "Fermi Level Pinning with Sub-Monolayer MeOx and Metal Gates," IEEE International Electron Device Meeting, Dec. 8-10, 2003, pp. 13.1.1-13.1.4.

Wakabayashi, Hitoshi, et al., "A Dual-Metal Gate CMOS Technology Using Nitrogen-Concentration-Controlled TiNx Film," IEEE Transactions on Electron Devices, vol. 48, No. 10, Oct. 2001, pp. 2363-2369.

Wolf, S., et al., "Silicon Processing for the VLSI Era, vol. 1—Process Technology," Second Edition, Lattice Press, Oct. 1999, pp. 338 and 526.

Wolf, S., "Silicon Processing for the VLSI Era, vol. 2—Process Integration," Fifth Edition, Lattice Press, Mar. 1990, pp. 432-441.

Yeo, Yee-Chia, et al., "Dual-Metal Gate CMOS Technology with Ultrathin Silicon Nitride Gate Dielectric," IEEE Electron Device Letters, vol. 22, No. 5, May 2001, pp. 227-229.

CMOS TRANSISTOR WITH DUAL HIGH-K GATE DIELECTRIC AND METHOD OF MANUFACTURE THEREOF

This is a divisional application of U.S. application Ser. No. 10/870,616, entitled "CMOS Transistor With Dual High-k Gate Dielectric and Method of Manufacture Thereof," which was filed on Jun. 17, 2004 and is incorporated herein by reference.

CROSS-REFERENCE TO RELATED APPLICATION

This application relates to the following and commonly assigned patent application: Ser. No. 13/444,742, filed Apr. 11, 2012, entitled "CMOS Transistor With Dual High-k Gate Dielectric," which application is hereby incorporated herein by reference.

TECHNICAL FIELD

The present invention relates generally to semiconductor devices, and more particularly a structure for and a method of manufacturing a complementary metal oxide semiconductor (CMOS) transistor device.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOSFET processes used one type of doping to create either positive or negative channel transistors. More recent designs, referred to as complementary MOS (CMOS) devices, use both positive and negative channel devices in complementary configurations. While this requires more manufacturing steps and more transistors, CMOS devices are advantageous because they utilize less power, and the devices may be made smaller and faster.

The gate dielectric for MOSFET devices has in the past typically comprised silicon dioxide, which has a dielectric constant of about 3.9. However, as devices are scaled down in size, using silicon dioxide for a gate dielectric becomes a problem because of gate leakage current, which can degrade device performance. Therefore, there is a trend in the industry towards the development of the use of high dielectric constant (k) materials for use as the gate dielectric in MOSFET devices. The term "high k materials" as used herein refers to a dielectric material having a dielectric constant of about 4.0 or greater.

High k gate dielectric development has been identified as one of the future challenges in the 2002 edition of International Technology Roadmap for Semiconductors (ITRS), incorporated herein by reference, which identifies the technological challenges and needs facing the semiconductor industry over the next 15 years. For low power logic (for portable electronic applications, for example), it is important to use devices having low leakage current, in order to extend battery life. Gate leakage current must be controlled in low power applications, as well as sub-threshold leakage, junction leakage, and band-to-band tunneling.

To fully realize the benefits of transistor scaling, the gate oxide thickness needs to be scaled down to less than 2 nm. However, the resulting gate leakage current makes the use of such thin oxides impractical in many device applications where low standby power consumption is required. For this reason, the gate oxide dielectric material will eventually be replaced by an alternative dielectric material that has a higher dielectric constant. However, device performance using high k dielectric materials tends to suffer from trapped charge in the dielectric layer, which deteriorates the mobility, making the drive current lower than in transistors having silicon dioxide gate oxides, thus reducing the speed and performance of transistors having high k gate dielectric materials.

Another problem with using a high-k dielectric material as the gate electrode of a CMOS transistor is referred to in the art as a "Fermi-pinning" effect, which occurs at the interface of the gate electrode and gate dielectric material. Fermi-pinning is a problem that occurs in CMOS devices having both polysilicon and metal gates. The Fermi-pinning effect causes a threshold voltage shift and low mobility, due to the increased charge caused by the Fermi-pinning effect. Fermi-pinning causes an assymmetric turn-on threshold voltage $V_t$ for the two transistors of a CMOS device, which is undesirable.

In prior art CMOS transistor designs, the gate dielectric material for the CMOS was typically $SiO_2$ and the gate electrode was polysilicon. A symmetric threshold voltage $V_t$ for the PMOS device and the NMOS device of a prior art CMOS device was easily achievable using $SiO_2$ as a gate dielectric material. For the PMOS device, the gate electrode was P-type, which was typically achieved by using polysilicon doped with B as the PMOS gate electrode material, as examples. For the NMOS device, the gate electrode was N-type, which was typically achieved by using polysilicon doped with P as the NMOS gate electrode material, as examples.

However, when attempts are made to use hafnium-based dielectric materials, a high k dielectric material, for the gate dielectric material of a CMOS device, problems arise. For the NMOS device, polysilicon doped with P may be used as the material for the gate electrode, and an N-type gate is achievable, which is desired. However, for the PMOS device, if polysilicon doped with B, for example, is used for the gate electrode material, the hafnium-based gate electrode material interacts with adjacent materials, caused by Fermi-pinning, resulting in an N-type gate, which is ineffective for the PMOS device. An N-type gate on the PMOS transistor is undesirable: the PMOS device gate should be P-type to optimize the CMOS device performance and achieve a symmetric $V_{tp}$ and $V_{tn}$. Thus, a CMOS device having an N-type gate electrode for the PMOS transistor has an asymmetric $V_{tn}$ and $V_{tp}$, due to the Fermi-pinning effect of the high k dielectric material. Efforts have been made to improve the quality of high-k dielectric films and resolve the Fermi-pinning problems, but the efforts have resulted in little success.

In electronics, the "work function" is the energy (usually measured in electron volts) needed to remove an electron from the Fermi level to a point an infinite distance away outside the surface. Work function is a material property of any material, whether the material is a conductor, semiconductor, or dielectric. The work function of a metal is fixed and cannot be changed unless the material composition is changed, for example. The work function of a semiconductor can be changed by doping the semiconductor material. For example, undoped polysilicon has a work function of about 4.5 eV, whereas polysilicon doped with boron has a work function of about 5.0 eV. The work function of a semiconductor or conductor directly affects the threshold voltage of a transistor when the material is used as a gate electrode.

In prior art CMOS devices utilizing $SiO_2$ as the gate dielectric material, the work function can be changed or tuned by doping the polysilicon used for the gate electrode material. However, the Fermi-pinning caused by the use of high k gate dielectric materials as the gate dielectric pins or fixes the work function, so that doping the polysilicon gate material does not change the work function. Thus, a symmetric $V_t$ for the NMOS and PMOS transistors of a CMOS device having a high k material for the gate dielectric cannot be achieved by doping polysilicon gate material, as in $SiO_2$ gate dielectric CMOS devices.

Thus, what is needed in the art is a CMOS transistor device design and method of manufacturing thereof that has a high-k gate dielectric and a symmetric $V_t$ for the p channel metal oxide semiconductor (PMOS) and n channel metal oxide semiconductor (NMOS) transistors of the CMOS device.

SUMMARY OF THE INVENTION

These and other problems are generally solved or circumvented, and technical advantages are generally achieved, by preferred embodiments of the present invention which provide a CMOS transistor device design and method of manufacture thereof having a substantially symmetric threshold voltage $V_t$ for the PMOS and NMOS transistors. A different gate dielectric material is used for the PMOS transistor than for the NMOS transistor. Advantageously, the novel invention uses the Fermi-pinning effect to achieve a symmetric $V_t$, by disposing a Fermi-pinning material immediately beneath the gate of the PMOS transistor.

In accordance with a preferred embodiment of the present invention, a semiconductor device includes a workpiece, a first transistor formed in a first region of the workpiece, and a second transistor formed in a second region of the workpiece proximate the first region of the workpiece. The first transistor includes a first source and a first drain disposed in the workpiece, a first channel region disposed between the first source and the first drain, a first gate dielectric disposed over the first channel region, the first gate dielectric comprising a first material, and a first gate disposed over the first gate dielectric. The second transistor includes a second source and a second drain disposed in the workpiece, a second channel region disposed between the second source and the second drain, a second gate dielectric disposed over the second channel region, the second gate dielectric comprising a second material, and a second gate disposed over the second gate dielectric, wherein the second material is different from the first material.

In accordance with another preferred embodiment of the present invention, a method of manufacturing a semiconductor device includes providing a workpiece, the workpiece comprising a first region and a second region, forming a first gate dielectric material over the second region of the workpiece, forming a first gate material over the first gate dielectric material, forming a second gate dielectric material over the first region of the workpiece, the second gate dielectric material comprising a different material than the first gate dielectric material, and forming a second gate material over the second gate dielectric material. The method includes patterning the first gate material, the second gate material, the first gate dielectric material and the second gate dielectric material, wherein the first gate material comprises a first gate of a first transistor, wherein the first gate dielectric material comprises a first gate dielectric of the first transistor, wherein the second gate material comprises a second gate of a second transistor, and wherein the second gate dielectric material comprises a second gate dielectric of the second transistor.

Advantages of preferred embodiments of the present invention include providing a method of fabricating a CMOS device and structure thereof wherein the PMOS transistor and NMOS transistor have a symmetric $V_t$. The threshold voltage $V_t$ is decreased compared to prior art CMOS devices, and the flat band voltage is easier to tune. Embodiments of the invention may utilize high-k dielectric materials as the gate dielectric, using polysilicon, metal or FUSI gate electrodes. The metal gate electrodes may comprise either single metal or dual-work function metals, e.g., the gate electrode for the PMOS and NMOS transistor may be the same material or different materials.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise

DETAILED DESCRIPTION OF ILLUSTRATIVE EMBODIMENTS

Figure 1:
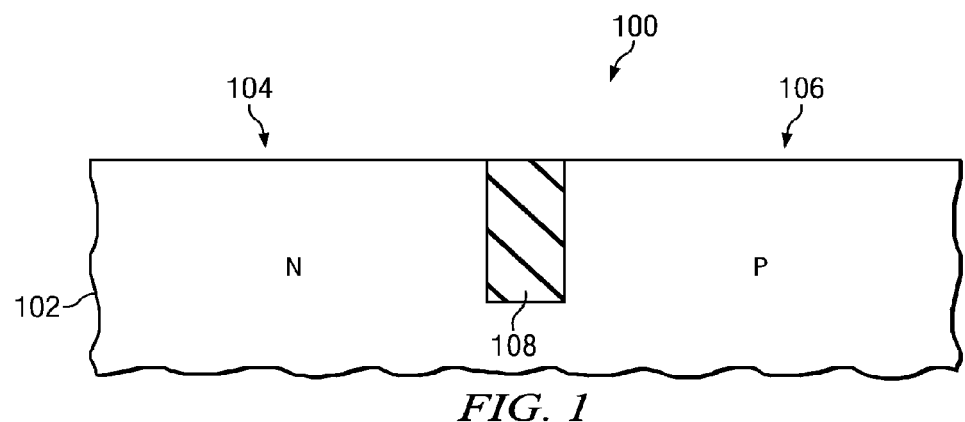
FIGS. 1 through 9 show cross-sectional views of a semiconductor device at various stages of manufacturing in accordance with a preferred embodiment of the present invention, wherein a CMOS device comprises a PMOS transistor having a first gate dielectric material and an NMOS transistor having a second gate dielectric material, wherein the first gate dielectric material and the second gate dielectric material comprise different materials.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

High-k gate dielectrics generally yield orders of magnitude lower gate leakage current than $SiO_2$ gate dielectrics with the same effective oxide thickness (EOT). For low standby power (LSTP) applications, the use of a high-k material for a gate dielectric is a potential solution in the roadmap for the advanced technology nodes. Using high-k materials for gate dielectrics in CMOS devices has resulted in good EOT, lower gate leakage ($J_g$), mobility and hysteresis parameters, but the devices suffer from lack of $V_t$ controllability. In order to make high-k materials as gate dielectrics useful in CMOS applications, it is desirable that the CMOS device should be manufactured such that $V_{tn}$ and $V_{tp}$ are symmetrical; e.g., $V_{tn}$=0.3 V and $V_{tp}$=−0.3 V, as examples.

Attempts to use a high-k dielectric material such as $HfO_2$ have been problematic. In particular, attempts have been made to use $HfO_2$, which is a high-k dielectric material having a dielectric constant of about 25, as the gate dielectric for both the PMOS and NMOS FETs of a CMOS device. The work function of a polysilicon gate using a $HfO_2$ gate dielectric has been found to be pinned, as a result of Fermi-pinning, at a point close to the conduction band of polysilicon, causing the polysilicon gate to function as N-type polysilicon, even for the polysilicon gate doped with p-type dopant, for the PMOS device. Therefore, the threshold voltage $V_{tp}$ of the PMOS device was much higher than expected; e.g., $V_{tp}$ was −1.2 V while $V_{tn}$ was 0.4 V, which is very asymmetric. The Fermi-pinning effect is suspected to be related to the Hf—Si bond at the gate electrode-gate dielectric interface, which is almost impossible to avoid with a polysilicon-$HfO_2$ gate stack structure. Therefore, the Fermi-pinning effect makes the use of polysilicon as a gate electrode incompatible with Hf-based high-k gate dielectric materials in CMOS devices. Fully silicided polysilicon (FUSI) gates have also exhibited Fermi-pinning effects and are undesirable for use as gate electrode materials when a high-k dielectric such as hafnium is used for a gate dielectric.

Embodiments of the present invention derive technical advantages by disposing a thin layer of a Fermi-pinning material such as $Al_2O_3$ adjacent and abutting a gate electrode of a PMOS device, disposed over a high-k dielectric material such as $HfO_2$, while using single layer of high-k dielectric material as the gate dielectric for the NMOS device. By doing so, polysilicon or FUSI may be used as the gate electrode while still achieving a symmetric $V_{tp}$ and $V_{tn}$ for the CMOS device. In the PMOS portion, a polysilicon-$Al_2O_3$ interface sets the work function in the p-type regime, and in the NMOS portion, a polysilicon-Hf interface sets the work function in the n-type regime.

The present invention will be described with respect to preferred embodiments in a specific context, namely a CMOS transistor. Embodiments of the present invention may also be applied, however, to other semiconductor device applications where two or more transistors are required. Note that in the drawings shown, only one PMOS device and one NMOS device are shown; however, there may be many PMOS and NMOS devices formed during each of the manufacturing processes described herein.

FIGS. 1 through 9 show cross-sectional views of a semiconductor device 100 at various stages of manufacturing in accordance with a preferred embodiment of the present invention. With reference now to FIG. 1, there is shown a semiconductor device 100 in a cross-sectional view including a workpiece 102. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may also comprise a silicon-on-insulator (SOI) substrate.

The workpiece 102 includes a first region 104 and a second region 106. The first region 104 comprises a region where a first transistor comprising a PMOS device or PMOSFET, as examples, will be formed. The second region 106 comprises a region where a second transistor comprising an NMOS device or NMOSFET will be formed, as examples. The PMOS device and NMOS device are not shown in FIG. 1: see FIGS. 8 and 9 at 136 and 138, respectively.

The first region 104 and the second region 106 may be separated by an optional shallow trench isolation (STI) region 108 formed in the workpiece 102, as shown. The first region 104 may be lightly doped with N type dopants, and the second region 106 may be lightly doped with P type dopants. In general, the workpiece 102 is doped with N or P type dopants depending on whether the junctions of the transistor to be formed will be P or N type, respectively.

The workpiece 102 is preferably cleaned using a pre-gate clean process to remove any contaminant or native oxide from the top surface of the workpiece 102. The pre-gate treatment may comprise a HF, HCl or ozone based cleaning treatment, as examples, although the pre-gate treatment may alternatively comprise other chemistries.

Figure 2:
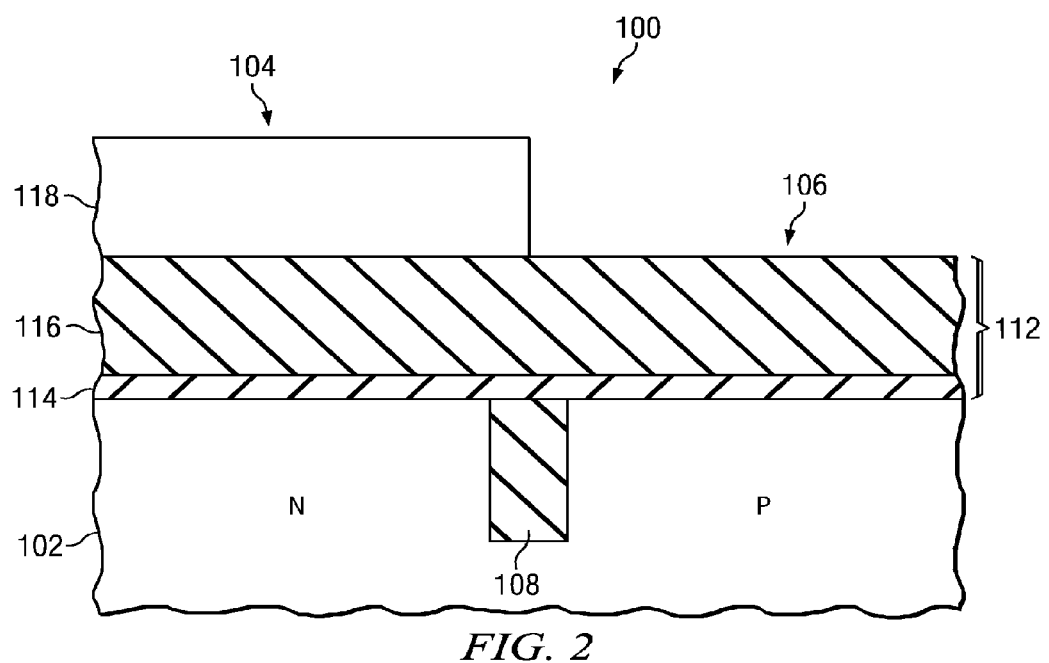

A hard mask 112 is deposited over the workpiece 102, as shown in FIG. 2. The hard mask 112 preferably comprises a first layer 114 and a second layer 116 disposed over the first layer 114, as shown. Alternatively, the hard mask 112 may comprise a single layer of an oxide or a nitride material, for example. In the embodiment shown in FIG. 2, the first layer 114 of the hard mask 112 preferably comprises about 300 Angstroms of an oxide material such as tetraethoxysilate (TEOS), although alternatively, the first layer 114 may comprise other insulating materials deposited in other dimensions, for example. The first layer 114 may be deposited by plasma-enhanced chemical vapor deposition (PECVD) or by other deposition techniques, as examples. The second layer 116 preferably comprises about 1500 Angstroms of a nitride material such as $Si_xN_y$, for example, although alternatively, the second layer 116 may comprise other insulating materials deposited in other dimensions, for example. The second layer 114 may be deposited by PECVD or by other deposition techniques, as examples.

A first layer of photoresist 118 is deposited over the second layer 116 of the hard mask 112, as shown in FIG. 2. The first layer of photoresist 118 may patterned with a mask using traditional lithography techniques, although alternatively, the first layer of photoresist 118 may be directly patterned using electron beam lithography (EBL) or other direct etching technique, as examples.

Figure 3:
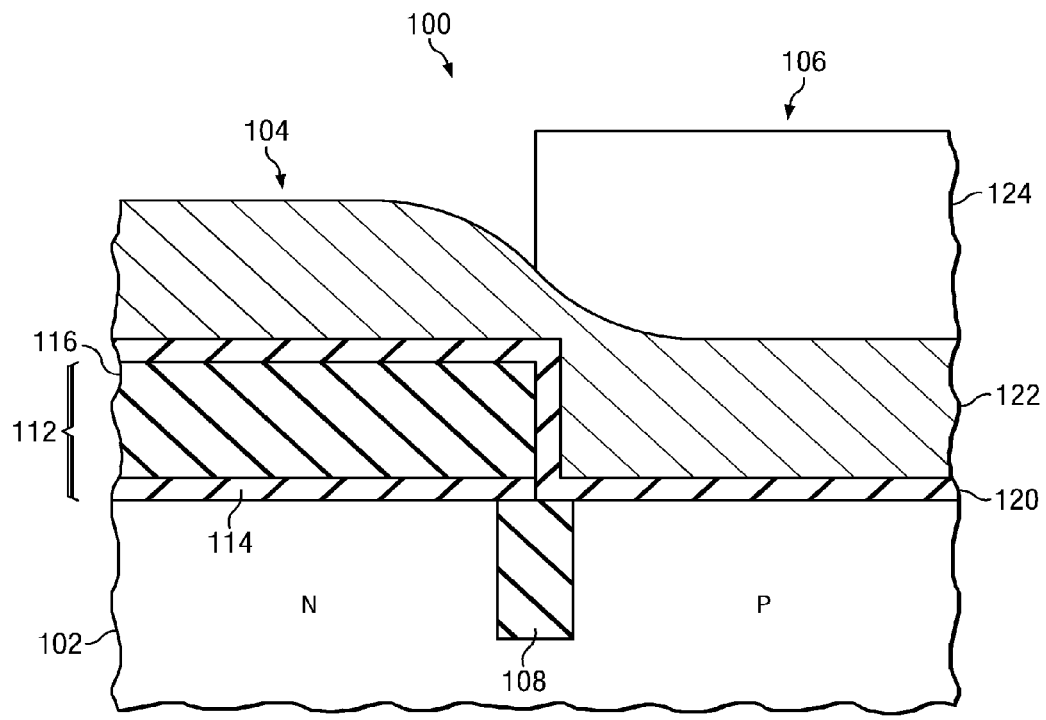

The first layer of photoresist 118 is used to pattern at least the second layer 116 of the hard mask 112, as shown in FIG. 3. For example, exposed portions of the second layer 116 in the second region 106 may be etched using the first layer of photoresist 118 remaining over the first region 104 as a mask. The etch process may be designed to stop when the first layer 114 of the hard mask 112 is reached. The first layer of photoresist 118 is then stripped or removed, and the second layer 116 is then used as a mask to pattern the first layer 114. Alternatively, the first layer of photoresist 118 may be used as a mask to etch both the second layer 116 and the first layer 114 of the hard mask 112, for example. The first layer of photoresist 118 is then stripped, as shown in FIG. 3.

A first gate dielectric material 120 is deposited over the patterned hard mask 112 and exposed portions of the workpiece 102, as shown in FIG. 3. The first gate dielectric material 120 preferably comprises a high-k dielectric material having a dielectric constant of about 4.0 or greater, in one embodiment. The first gate dielectric material 120 preferably comprises $HfO_2$, $HfSiO_x$, $Al_2O_3$, $ZrO_2$, $ZrSiO_x$, $Ta_2O_5$, $La_2O_3$, $SiO_2$, nitrides thereof, $Si_xN_y$, SiON, or combinations thereof, as examples, although alternatively, the first gate dielectric material 120 may comprise other high k insulating materials or other dielectric materials. The first gate dielectric material 120 may comprise a single layer of material, or alternatively, the first gate dielectric material 120 may comprise two or more layers. In one embodiment, one or more of these materials can be included in the first gate dielectric material 120 in different combinations or in stacked layers. The first gate dielectric material 120 may be deposited by chemical vapor deposition (CVD), atomic layer deposition (ALD), metal organic chemical vapor deposition (MOCVD), physical vapor deposition (PVD), or jet vapor deposition (JVD), as examples, although alternatively, the first gate dielectric material 120 may be deposited using other suitable deposition techniques. The first gate dielectric material 120 preferably comprises a thickness of about 10 Å to about 60 Å in one embodiment, although alternatively, the first gate dielectric material 120 may comprise other dimensions, such as about 80 Å or less, as an example.

A first gate material 122 is deposited over the first gate dielectric material 120, also shown in FIG. 3. The first gate material 122 preferably comprises a conductor, such as a metal or polysilicon, although alternatively, other conductive and semiconductive materials may be used for the first gate material 122. In the embodiment shown in FIG. 1-9, the first gate material 122 preferably comprises polysilicon or other semiconductor materials. However, the first gate material 122 may alternatively comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, a fully silicided gate material (FUSI), other metals, and/or combinations thereof, as examples. If the gate material 122 comprises FUSI, for example, polysilicon may be deposited over the gate dielectric material 120, and a metal such as nickel may be deposited over the polysilicon, although other metals may be used. The workpiece 102 may then be heated to about 600 or 700 degrees C. to form a single layer of nickel silicide.

The first gate material 122 may comprise a plurality of stacked gate materials, such as a metal underlayer with a polysilicon cap layer disposed over the metal underlayer, or a combination of a plurality of metal layers that form a gate electrode stack. The first gate material 122 may be deposited using CVD, PVD, ALD, or other deposition techniques, as examples. The first gate material 122 preferably comprises a thickness of about 1500 Å, although alternatively, the first gate material 122 may comprise about 1000 Å to about 2000 Å, or other dimensions, for example.

If the first gate material 122 comprises a semiconductive material, such as in the embodiment shown in FIGS. 1-9, preferably, the first gate material 122 is N-doped, by doping the first gate material 122 with N type dopants such as phosphorous or antimony, for example. Doping the first gate material 122 makes the semiconductive material conductive or more conductive.

A second layer of photoresist 124 is deposited over the first gate material 122, as shown in FIG. 3. The second layer of photoresist 124 may patterned using a mask using traditional lithography techniques to remove the second layer of photoresist 124 from over the first region 104 of the workpiece 102, as shown, although alternatively, the second layer of photoresist 124 may be directly patterned.

Figure 4:
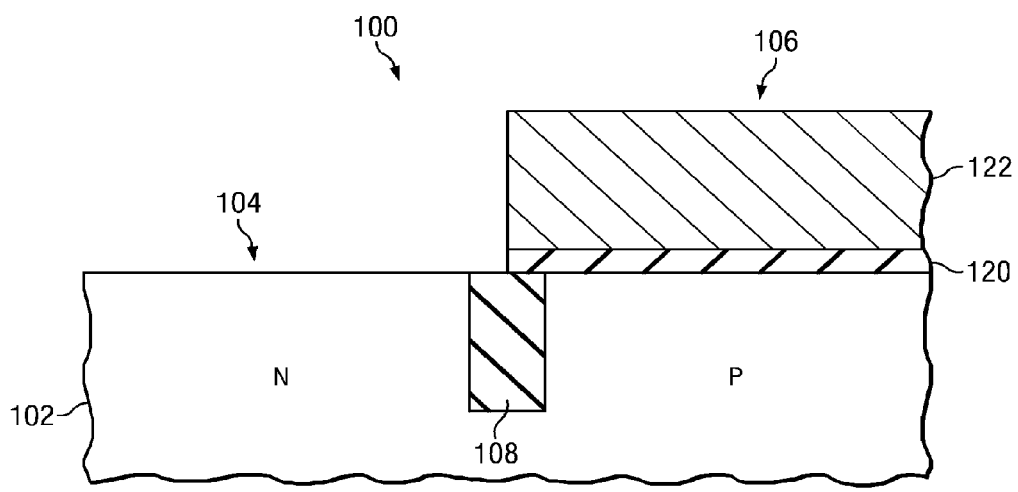

The second layer of photoresist 124 is used as a mask to pattern the first gate material 122 and the first gate dielectric material 120, and to remove the hard mask 112 from the first region 104 of the workpiece 102, as shown in FIG. 4. For example, exposed portions of the first gate material 122, first gate dielectric material 120, and hard mask 112 may be etched away from the first region 104 of the workpiece 102 using the second layer of photoresist 124 as a mask. The second layer of photoresist 124 is then stripped or removed from over the second region 106 of the workpiece 102. Any excess first gate material 122 and first gate dielectric material 120 may be removed from over the optional STI region 108 proximate the interface of the first region 104 and second region 106 using a chemical-mechanical polish (CMP) process or an etch process, for example, leaving the structure shown in FIG. 4. The exposed surface of the workpiece 102 may be cleaned using a pre-gate clean process.

Figure 5:
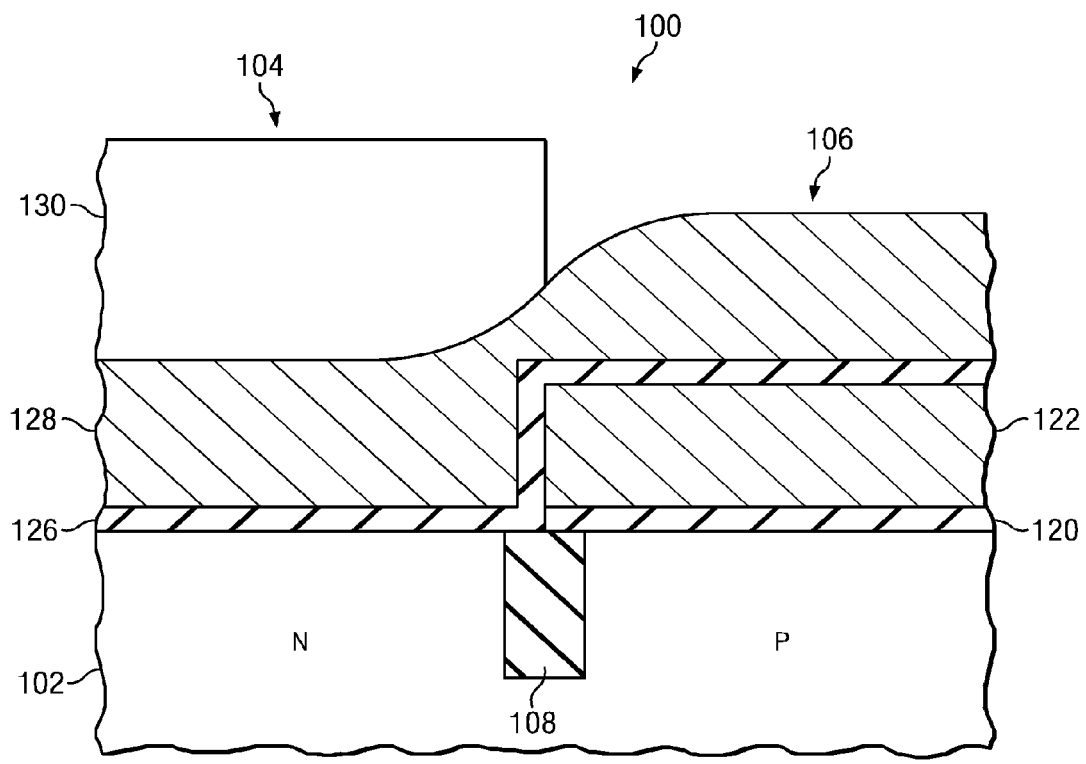

Next, a second gate dielectric material 126 is deposited over exposed portions of the workpiece 102 in the first region 104 and over the patterned first gate material 122 and first gate dielectric material 120 in the second region 106, as shown in FIG. 5. The second gate dielectric material 126 preferably comprises a different material than the first gate dielectric material 126 in one embodiment of the present invention. The second gate dielectric material preferably comprises a high-k dielectric material having a dielectric constant of about 4.0 or greater, in one embodiment. The second gate dielectric material 126 preferably comprises $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $SiO_2$, or combinations thereof, as examples, although alternatively, the second gate dielectric material 126 may comprise other high k insulating materials or other dielectric materials.

The second gate dielectric material 126 may comprise a single layer of material, or alternatively, the second gate dielectric material 126 may comprise two or more layers, wherein the top layer comprises a Fermi-pinning material, which will be described further herein with reference to FIG. 10. In one embodiment, one or more of these materials can be included in the second gate dielectric material 126 in different combinations or in stacked layers. The second gate dielectric material 126 may be deposited by CVD, ALD, MOCVD, PVD, or JVD, as examples, although alternatively, the second gate dielectric material 126 may be deposited using other suitable deposition techniques. The second gate dielectric material 126 preferably comprises a thickness of about 10 Å to about 60 Å in one embodiment, although alternatively, the second gate dielectric material 126 may comprise other dimensions, such as about 80 Å or less, as an example. The second gate dielectric material 126 preferably comprises a Fermi-pinning material such as an aluminum-containing material disposed at the top surface thereof.

Next, a second gate material 128 is deposited over the second gate dielectric material 126, also shown in FIG. 5. The second gate material 128 preferably comprises a conductor, such as a metal or polysilicon, although alternatively, other conductive and semiconductive materials may be used for the second gate material 128. In the embodiment shown in FIG. 1-9, the second gate material 128 preferably comprises polysilicon or other semiconductor materials. However, the second gate material 128 may alternatively comprise TiN, HfN, TaN, W, Al, Ru, RuTa, TaSiN, NiSi$_x$, CoSi$_x$, TiSi$_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, a fully silicided gate material (FUSI), other metals, and/or combinations thereof, as examples. The second gate material 128 may comprise a plurality of stacked gate materials, such as a metal underlayer with a polysilicon cap layer disposed over the metal underlayer, or a combination of a plurality of metal layers that form a gate electrode stack. The second gate material 128 may be deposited using CVD, PVD, ALD, or other deposition techniques, as examples. The second gate material 128 preferably comprises a thickness of about 1500 Å, although alternatively, the second gate material 128 may comprise about 1000 Å to about 2000 Å, or other dimensions, for example. The second gate material 128 may comprise the same material as the first gate material 122, or alternatively, the second gate material 128 may comprise a different material than the first gate material 122, for example.

If the second gate material 128 comprises a semiconductive material, such as in the embodiment shown in FIGS. 1-9, preferably, the second gate material 128 is P-doped, by doping the second material 128 with a P type dopant such as boron, as an example. Doping the second gate material 128 makes the semiconductive material conductive or more conductive.

A third layer of photoresist 130 is deposited over the second gate material 128, as shown in FIG. 5. The third layer of photoresist 130 may patterned using a mask by traditional lithography techniques to remove the third layer of photoresist 130 from the second region 106 of the workpiece 102, as shown, although alternatively, the third layer of photoresist 130 may be directly patterned.

Figure 6:
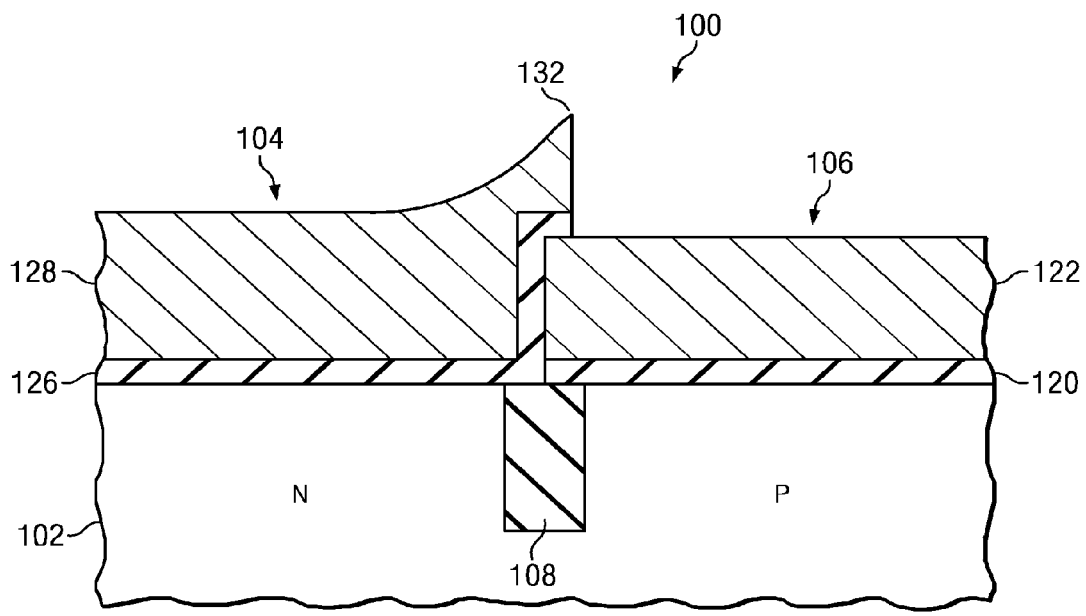

The third layer of photoresist 130 is then used as a mask to pattern the second gate material 128 and second gate dielectric material 126, as shown in FIG. 6. For example, exposed portions of the second gate material 128 and second gate dielectric material 126 may be etched away from the second region 106 of the workpiece 102 using the third layer of photoresist 130 as a mask. The third layer of photoresist 130 is then stripped or removed from over the first region 104 of the workpiece 102.

Figure 7:
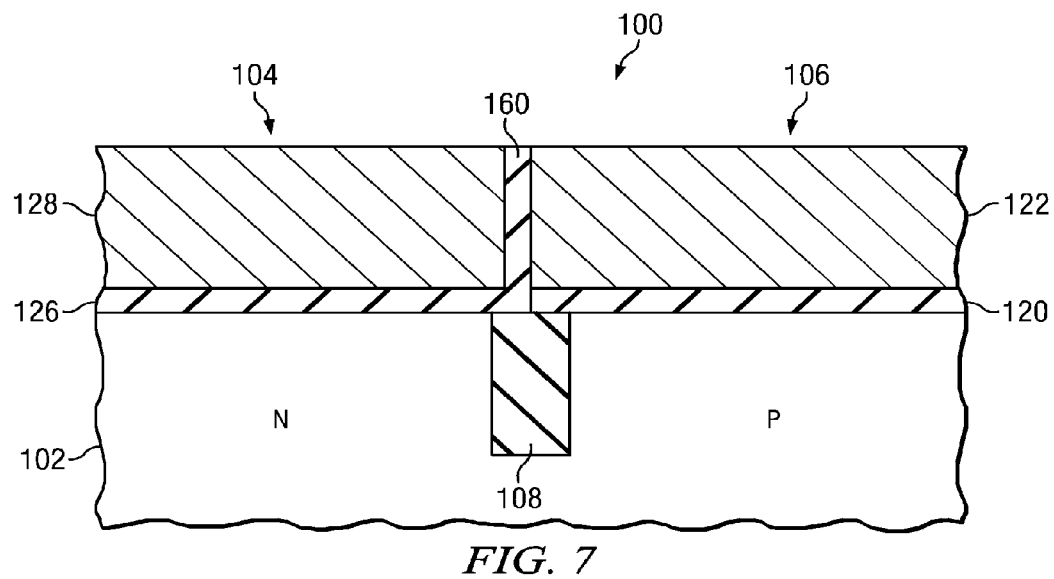

Any excess second gate material 128 and second gate dielectric material 126 (e.g., as shown at peak 132) may be removed from over the optional STI region 108 proximate the interface of the first region 104 and second region 106 using a chemical-mechanical polish (CMP) process or an etch process, for example (not shown), leaving the structure shown in FIG. 7.

Figure 8:
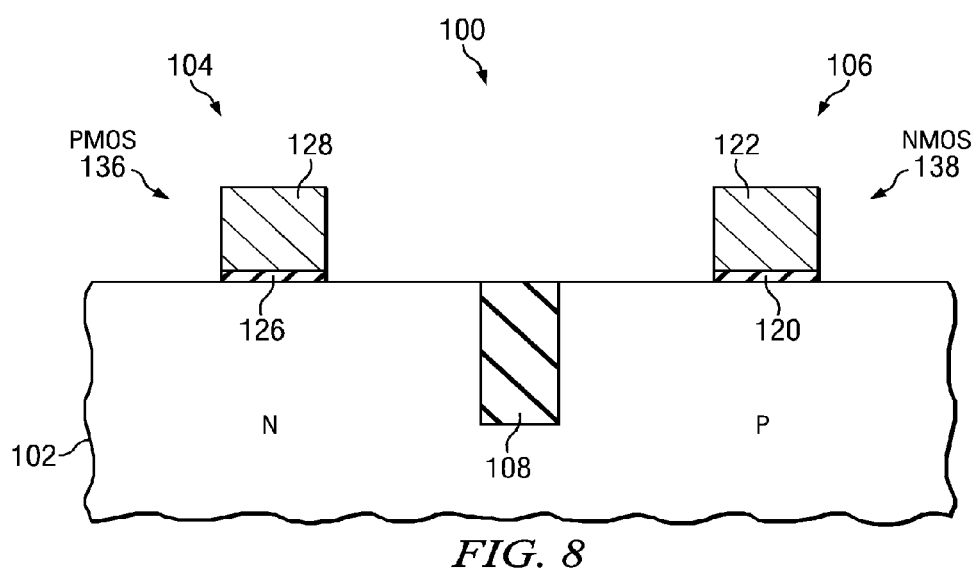

Preferably using a single lithography step, e.g., using a single layer of photoresist and using a single mask to pattern the photoresist, the first gate material 120, the first gate dielectric material 122, the second gate material 126, and the second gate dielectric material 128 are simultaneously patterned with a desired pattern for a CMOS device, leaving the structure shown in FIG. 8, wherein a PMOS transistor 136 is formed in the first region 104, and an NMOS transistor 138 is formed in the second region 106.

Referring again to FIG. 7, note that while a vertical portion 160 of the second gate dielectric material 126 formed on the sidewall of the first gate material 122 is left remaining in the structure shown in FIG. 7, this is not problematic, because portion 160 is etched away or removed when the PMOS and NMOS transistors 136 and 138 are formed, as shown in FIG. 8.

Manufacturing of the CMOS device 100 is then continued to complete the fabrication of the CMOS device 100. For example, spacers 134 may be formed on the sidewalls of the gate electrode materials 128 and 122, and on the sidewalls of the gate dielectric materials 126 and 120, forming the structure shown in FIG. 9. Source and drain regions S1 and D1, and S2 and D2 may be formed in exposed surfaces of the PMOS transistor 136 and the NMOS transistor 138, respectively. For example, the source and drain regions S1 and D1 may be doped with P type dopants to form p-n-p junctions in the PMOS transistor 136. Likewise, the source and drain regions S2 and D2 may be doped with N type dopants to form n-p-n junctions in the NMOS transistor 138.

One or more insulating materials (not shown) may be deposited over the PMOS transistor 136 and NMOS transistor 138, and contacts may be formed in the insulating materials in order to make electrical contact with the gates, sources and/or drains. Additional metallization and insulating layers may be formed and patterned over the top surface of the insulating material and contacts. A passivation layer (not shown) may be deposited over the insulating layers or the PMOS transistor 136 and NMOS transistor 138. Bond pads (also not shown) may be formed over contacts, and the semiconductor device 100 may then be singulated or separated into individual die. The bond pads may be connected to leads of an integrated circuit package (not shown) or other die, for example, in order to provide electrical contact to the transistors 136 and 138 of the semiconductor device 100.

Figure 9:
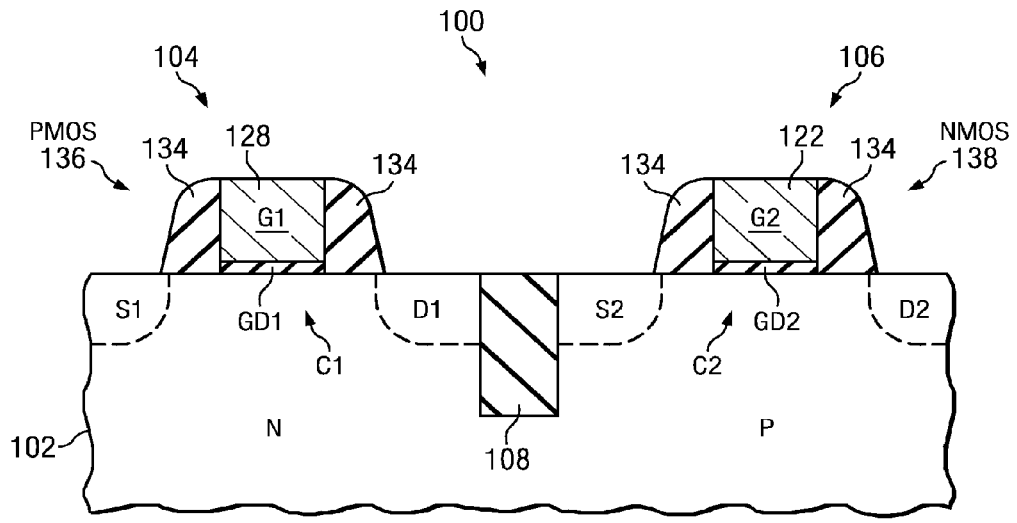

Thus, a novel semiconductor CMOS device 100 comprising a PMOS transistor 136 and an NMOS transistor 138 is formed, as shown in FIG. 9, wherein the gate dielectric GD1 of the PMOS transistor 136 comprises a different material from the material of the gate dielectric GD2 of the NMOS transistor 138. The gate dielectric GD1 of the PMOS transistor 136 preferably comprises a Fermi-pinning material abutting the gate G1. The PMOS transistor 136 includes a source S1 and a drain D1 separated by a first channel region C1. A gate dielectric GD1 is disposed over the first channel region C1, and a gate G1 is disposed over the gate dielectric GD1. The NMOS transistor 138 includes a source S2 and a drain D2 separated by a channel region C2. A gate dielectric GD2 is disposed over the channel region C2, and a gate G2 is disposed over the gate dielectric GD2. A spacer 134 comprising an oxide or nitride, as examples, may be formed on the sidewalls of the gates G1 and G2, and gate dielectrics GD1 and GD2, as shown.

The gate and gate dielectric materials for either the PMOS transistor 136 or the NMOS transistor 138 may be deposited first, in accordance with embodiments of the present invention. For example, in the embodiment described herein, the NMOS transistor 138 gate dielectric and gate materials are deposited first. Alternatively, the PMOS transistor 136 gate dielectric and gate materials may be deposited first.

Figure 10:
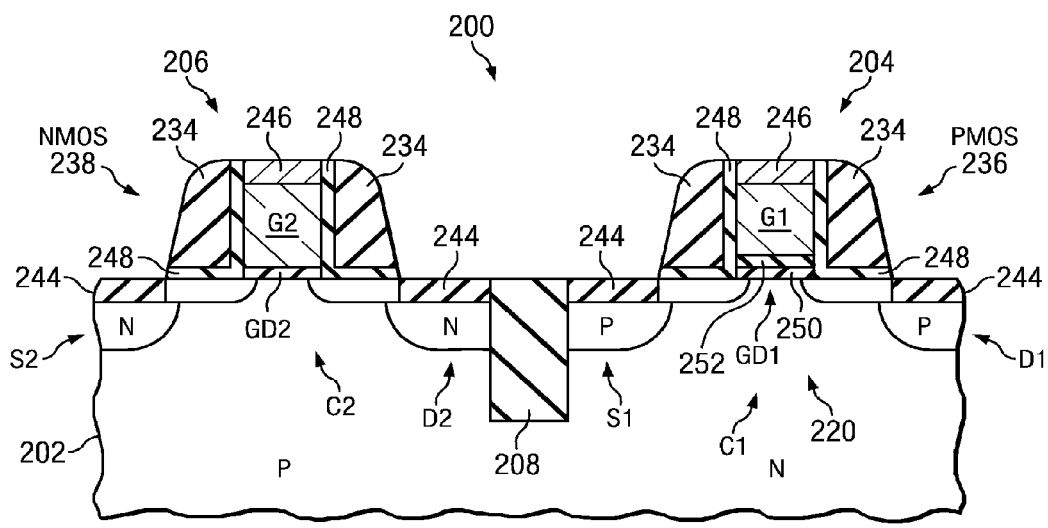
FIG. 10 shows an another preferred embodiment of the present invention, wherein the PMOS transistor gate dielectric comprises a first layer and a second layer, wherein the second layer is adjacent and abuts the PMOS transistor gate electrode, and wherein the second layer comprises a Fermi-pinning material.

Another preferred embodiment of the present invention is shown in FIG. 10. Like numerals are used for the various elements that were described in FIGS. 1 through 9. To avoid repetition, each reference number shown in FIG. 10 is not described again in detail herein. Rather, similar materials x02, x04, x06, x08, etc. . . . are preferably used for the various material layers shown as were described for FIGS. 1 through 9, where x=1 in FIGS. 1 through 9 and x=2 in FIG. 10. As an example, the preferred and alternative materials and dimensions described for the first and second gate dielectric materials 120 and 126 (GD2 and GD1, respectively) in the description for FIGS. 1 through 9 are preferably also used for the gate dielectric materials GD1 and GD2 of FIG. 10.

In this embodiment, the PMOS device 204 is shown in the right side of the figure, and the NMOS device 206 is shown on the left side. The gate dielectric GD1 in this embodiment comprises at least two insulating layers: a first insulating layer 250 and a second insulating layer 252 disposed over the first insulating layer 250. The first insulating layer 250 preferably comprises a high-k dielectric material, and may comprise $HfO_2$, $HfSiO_x$, $ZrO_2$, $ZrSiO_x$, $Ta_2O_5$, $La_2O_3$, nitrides thereof, $Si_xN_y$, SiON, $SiO_2$, or combinations thereof, as examples, although alternatively, the first insulating layer 250 may comprise other high k insulating materials or other dielectric materials. The first insulating layer 250 preferably comprises a thickness of about 80 Angstroms or less, for example. The second insulating layer 250 preferably comprises about 10 to 60 Angstroms of a Fermi-pinning material. For example, the second insulating layer 250 preferably comprises an aluminum-containing material such as aluminum oxide ($Al_xO_y$ or $Al_2O_3$) or nitrides thereof, such as $Al_xO_yN_{1-x-y}$, as examples, although alternatively, the second insulating layer 250 may comprise other materials that induce Fermi-pinning of the gate dielectric GD1 to the gate electrode G1 of the PMOS device 236. The second insulating layer 250 may be deposited or may be formed by implanting a Fermi-pinning material such as aluminum, for example.

This embodiment also shows other optional elements that may be included in the CMOS device 200. Before forming spacers 234 over the sidewalls of the gate dielectric GD1 and GD2 and gates G1 and G2, an optional thin insulator 248 may be formed over the top surface of the sources S1 and S2 and drains D1 and D2, the sidewalls of the gate dielectrics GD1 and GD2, and gates G1 and G2, as shown. The spacers 234 are then formed over the thin insulator 248. The thin insulator 248 may comprise an oxide, and the spacers 234 may comprise a nitride, although alternatively, other materials may be used for the thin insulator 248 and the spacers 234, for example.

The sources S1 and S2 or the drains D1 and D2, or the gates G1 and G2, may include an optional silicide material 244 and 246, respectively, formed at a top surface thereof (often referred to as a salicide because the formation of the silicide may be self-aligning). The silicide 244 and 246 may comprise about 100 Å to 300 Å of $TiSi_x$, $CoSi_x$, or $NiSi_x$, although the silicide 244 and 246 may alternatively comprise other materials and thicknesses, as examples. The sources S1 and S2 and drains D1 and D2 may include lightly doped areas and deeper implantation regions, as shown.

The novel CMOS device of embodiments of the present invention described herein having a PMOS transistor and an NMOS transistor that have gate dielectrics comprising different materials may be manufactured using other methods. Two examples of such other methods are shown FIGS. 11 through 16, and FIGS. 17 and 18, respectively. Again, like numerals are used for the various elements that were described in FIGS. 1 through 9 and 10, and to avoid repetition, each reference number shown in FIGS. 11 through 16, and FIGS. 17 and 18 is not described again in detail herein. Rather, similar materials x02, x04, x06, x08, etc. . . . are preferably used for the various material layers shown as were described for FIGS. 1 through 9, where x=1 in FIGS. 1 through 9, x=2 in FIG. 10, x=3 in FIGS. 11 through 16, and x=4 in FIGS. 17 and 18.

Figure 11:
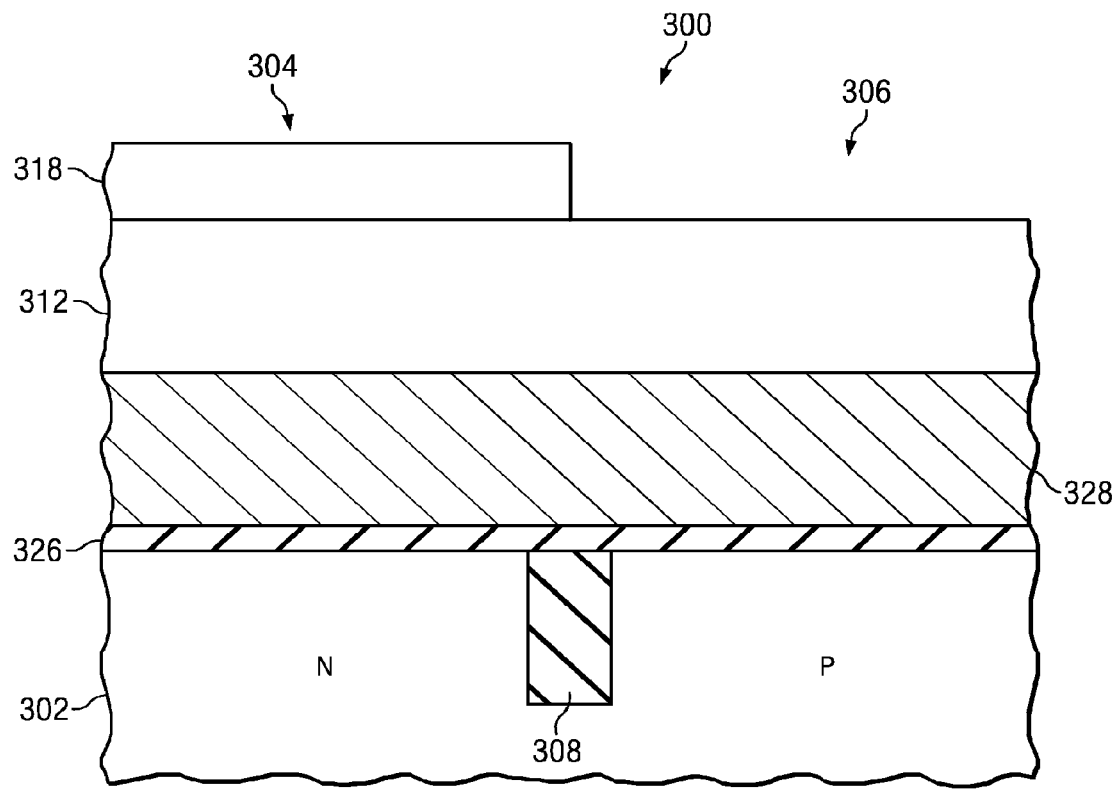
FIGS. 11 through 16 show cross-sectional views of a method of forming a CMOS device having different gate dielectric materials for the PMOS transistor and NMOS transistor in accordance with another preferred embodiment of the present invention at various stages of manufacturing.
Figure 12:
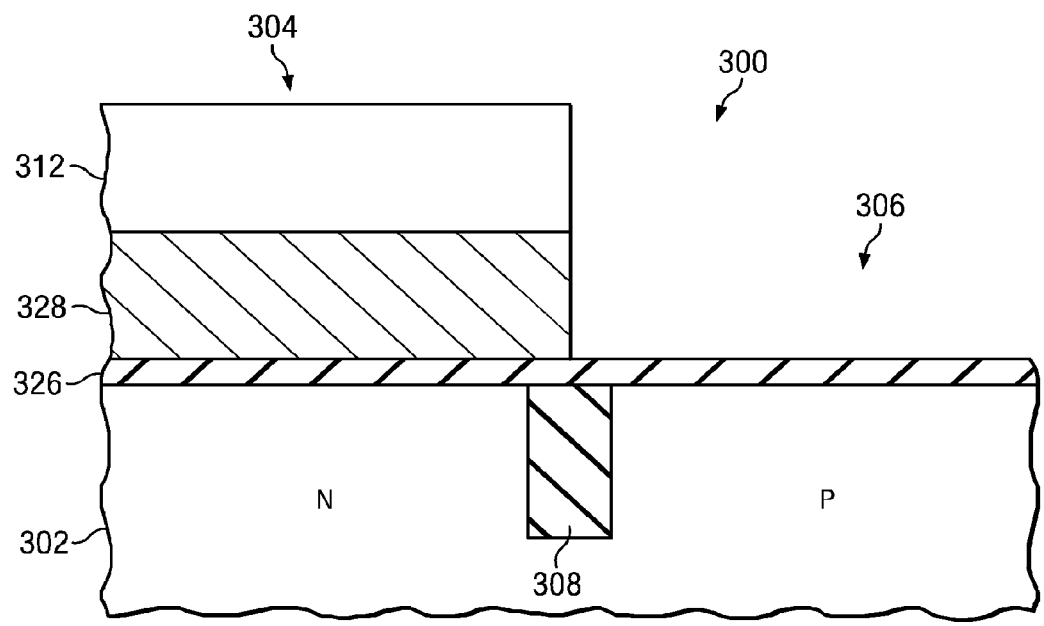
Figure 13:
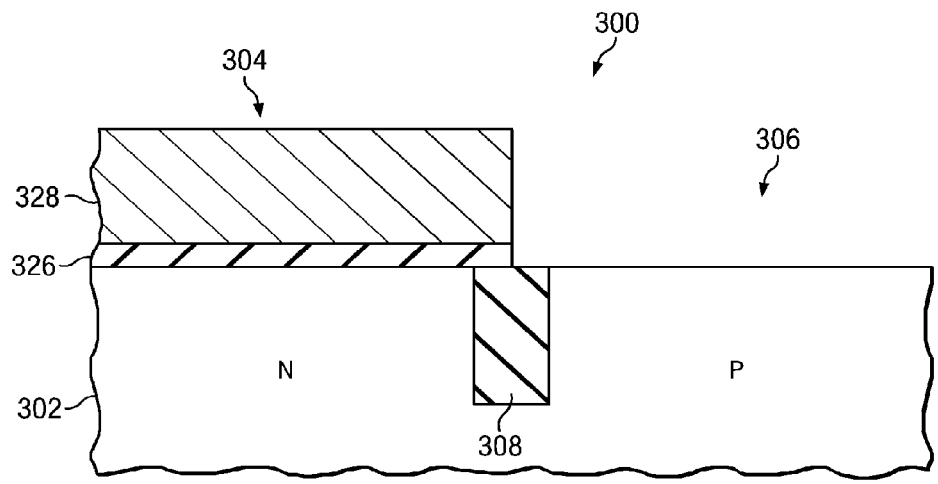

FIGS. 11 through 16 show cross-sectional views of a method of forming a CMOS device having different gate dielectric materials for the PMOS transistor and NMOS transistor in accordance with another preferred embodiment of the present invention at various stages of manufacturing. In this embodiment, starting with a workpiece such as 102 shown in FIG. 1, the second gate dielectric material 326 is deposited over the entire top surface of the workpiece 302. The second gate material 328 is then deposited over the entire surface of the second gate dielectric material 326, as shown. If the second gate material 328 comprises polysilicon, the polysilicon may be implanted with a P-type dopant, for example. The second gate material 328 and the second gate dielectric material 326 are then removed from over the second region 306 of the workpiece, as shown in FIGS. 12 and 13.

For example, a hard mask 312 may be formed over the second gate material 328. A layer of photoresist 318 may be deposited over the hard mask 312, and the photoresist 318 may be removed from over the second region 306 using lithography techniques, for example, as shown in FIG. 11. The hard mask 312 may comprise about 300 Angstroms of TEOS, for example, although alternatively, the hard mask 312 may comprise other materials and dimensions. The photoresist 318 may be used as a mask to pattern the hard mask 312 and second gate material 328 to remove layers 312 and 328 from over the second region 306 of the workpiece 302, and the photoresist 318 may be stripped or ashed, as shown in FIG. 12. The second gate dielectric material 326 may then be etched, using sputter and/or wet etch techniques, for example, to remove layer 326 from over the second region 306 of the workpiece 302, using the hard mask 312 as a mask, leaving the structure shown in FIG. 13, for example. The hard mask 312 may be consumed or removed during the etching of the second gate dielectric material 326, or alternatively, any excess hard mask 312 remaining over the second region 306 of the workpiece may be removed.

Figure 14:
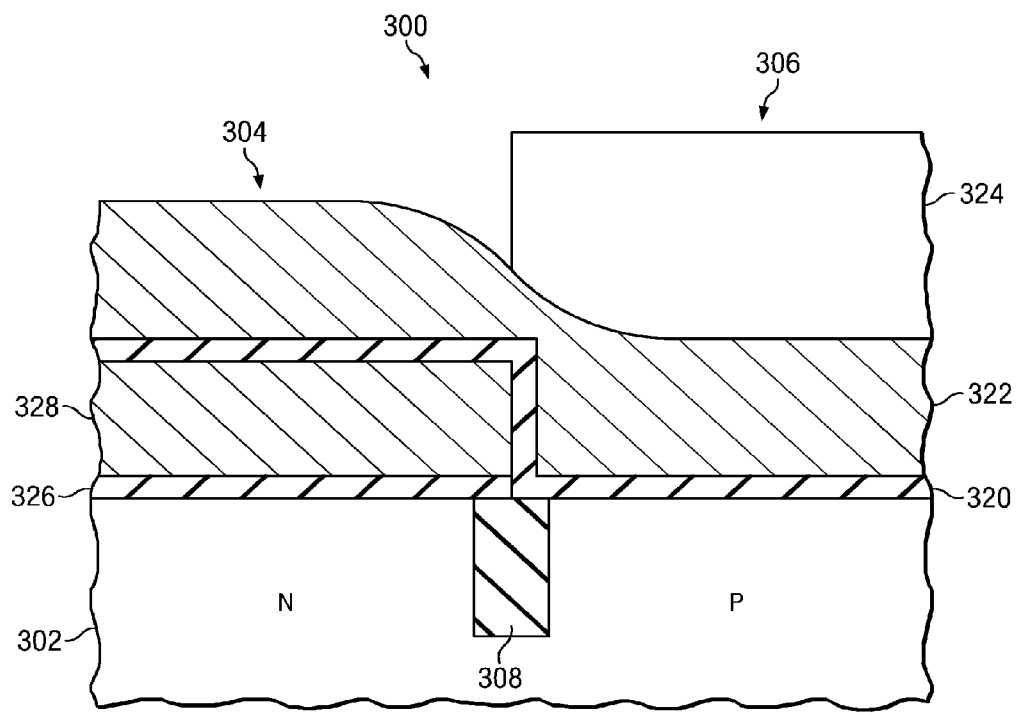
Figure 15:
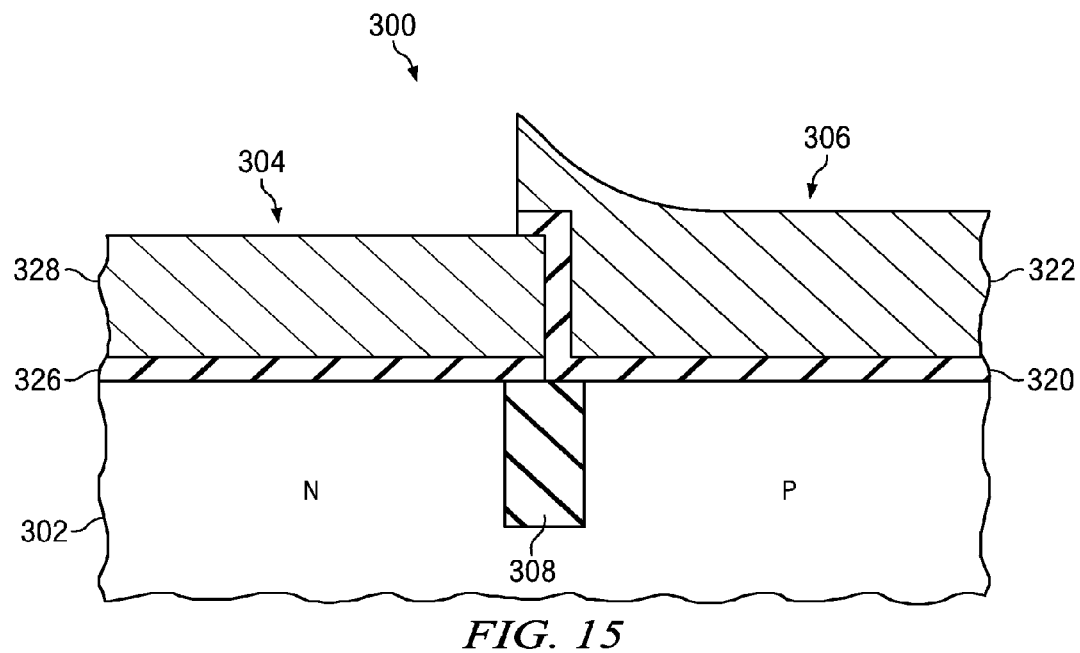

Next, the first gate dielectric material 320 and the first gate material 322 are deposited over the second region 306 of the workpiece 302 and over the second gate material 328 over the first region 304 of the workpiece 302, as shown in FIG. 14. The first gate dielectric material 320 and the first gate material 322 are then removed from over the first region 304 of the workpiece. For example, a layer of photoresist 324 may be deposited over the workpiece 302, and the photoresist 324 may be patterned to remove the photoresist 324 from over the first region 304 of the workpiece 302, as shown in FIG. 14. The photoresist 324 is then used as a mask while the first gate material 322 and the first gate dielectric material 320 are moved from the first region 304 of the workpiece. The photoresist 324 is then removed, as shown in FIG. 15, and the top surface of the first gate material 322 and the second gate material 328 are then planarized, e.g., using CMP or an etch process, for example, leaving the structure shown in FIG. 16.

Figure 16:
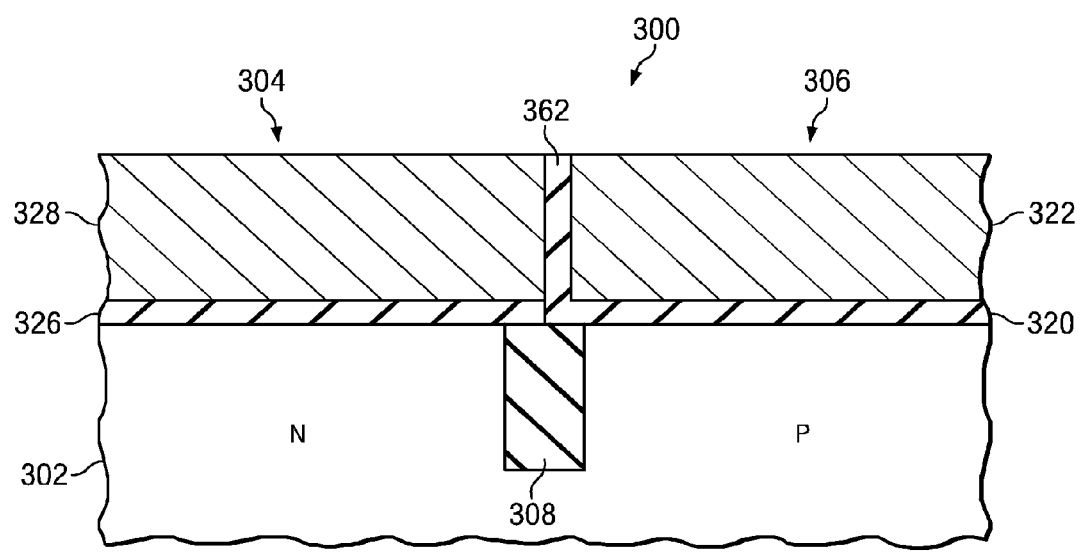

While a vertical portion 362 of the first gate dielectric material 320 formed on the sidewall of the second gate material 322 is left remaining in the structure shown in FIG. 16, this is not problematic, because portion 362 will be etched away when the PMOS and NMOS transistors are formed, as shown in FIGS. 8 through 10.

The embodiment shown in FIGS. 11 through 16 is advantageous in that one less lithography mask is required, compared to the embodiment shown in FIGS. 1 through 9.

Figure 17:
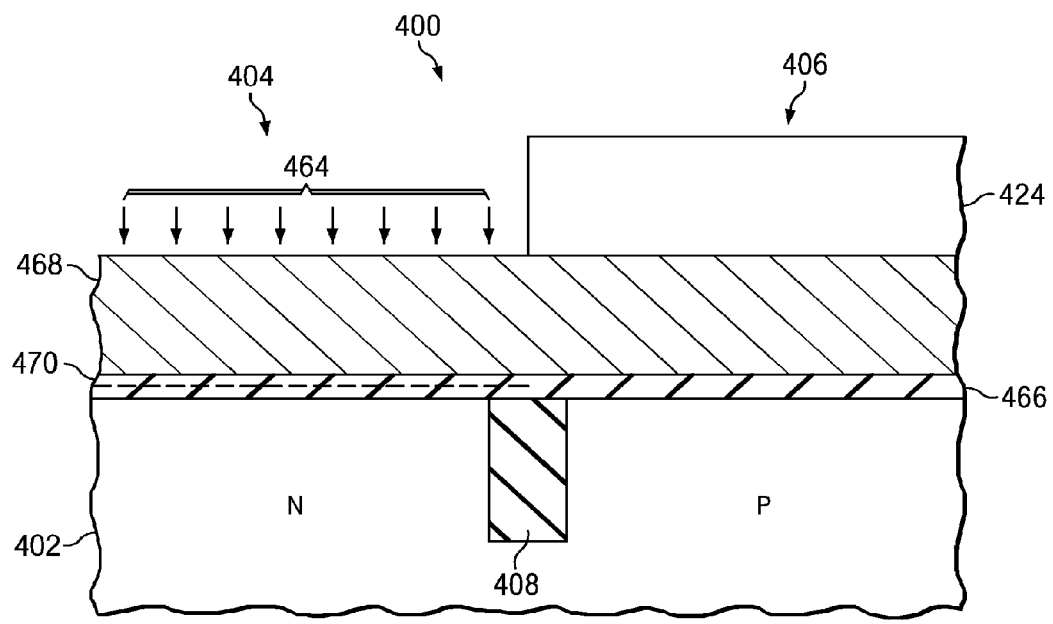
FIGS. 17 and 18 show cross-sectional views of a method of forming a CMOS device having different gate dielectric materials for the PMOS transistor and NMOS transistor in accordance with yet another preferred embodiment of the present invention at various stages of manufacturing.
Figure 18:
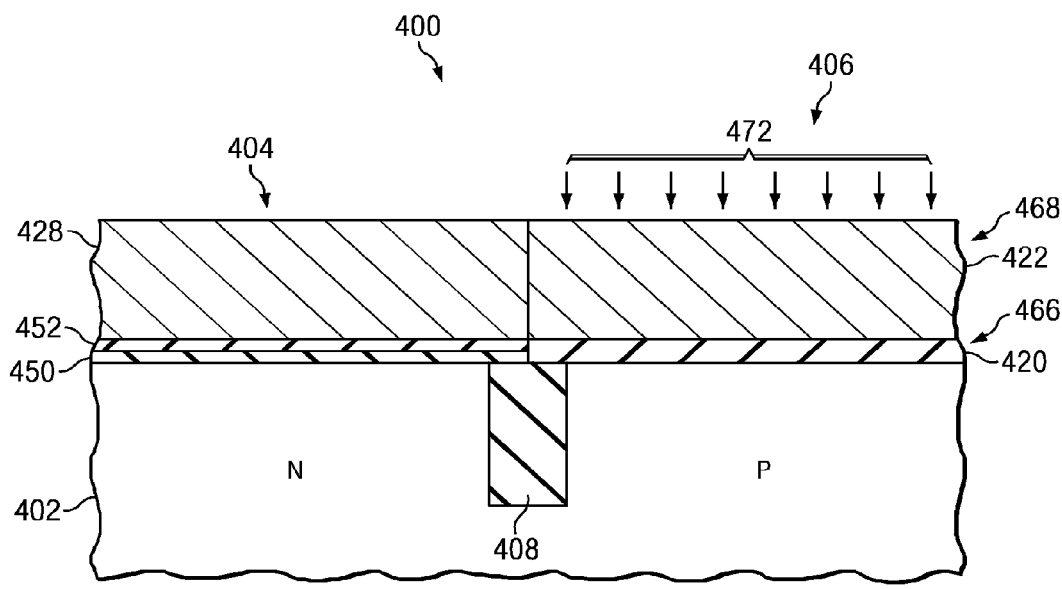

FIGS. 17 and 18 show cross-sectional views of a method of forming a CMOS device having different gate dielectric materials for the PMOS transistor and NMOS transistor in accordance with yet another preferred embodiment of the present invention. In this embodiment, advantageously, a single layer of gate dielectric material 466 and a single layer of gate material 468 are deposited over the top surface of the workpiece 402. The single layer of gate dielectric material 466 and the single layer of gate material 468 may comprise one type of material, or may alternatively comprise one or more material layers, for example. The single layer of gate dielectric material 466 is also referred to herein as an insulating layer 466, and the single layer of gate material 468 is also referred to herein as a conductive layer 468, for example.

The gate dielectric material 466 preferably comprises $HfO_2$, $HfSiO_X$, $Al_2O_3$, $ZrO_2$, $ZrSiO_X$, $Ta_2O_5$, $La_2O_3$, nitrides thereof, $Si_xN_y$, SiON, $SiO_2$, or combinations thereof, for example, although alternatively, the gate dielectric material 466 may comprise other materials. The gate dielectric material 466 may comprise a thickness of a few hundred Angstroms or less, for example. The gate material 468 may comprise a semiconductor material or a metal, for example. For example, the gate material 468 may comprise polysilicon, other semiconductor materials, TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, a fully silicided gate material (FUSI), other metals, and/or combinations thereof, as examples.

In this embodiment, in the first region 404 where a PMOS transistor will be formed, a Fermi-pinning material 464 is implanted. Preferably, the Fermi-pinning material 464 is implanted in the first region 404 but not in the second region 406, as shown. For example, the gate material 468 may be covered with photoresist 424 or an insulating material during the implantation process, as shown. Implanting the Fermi-pinning material 464 may comprise implanting aluminum, for example, although alternatively, the Fermi-pinning 464 may comprise other Fermi-pinning materials.

Preferably, the Fermi-pinning material 464 is implanted into at least the conductive layer 468 over the first region 404 of the workpiece 402, as shown. For example, the Fermi-pinning material 464 is preferably also implanted into a top surface 470 of the insulating layer 466.

Because the Fermi-pinning material 464 is implanted into the first region 404 and not the second region 406, the gate material and gate dielectric material for the first region 404 and second region 406 are now advantageously different, producing the novel CMOS device having different gate dielectric materials and symmetric $V_t$ for a PMOS transistor and NMOS transistor, as shown in FIGS. 9 and 10.

Note that optionally, the gate material 468 in the first region 404 may be doped with a P-type dopant while the second region 406 is masked. Similarly, and the gate material 468 in the second region 406 may optionally be doped with an N-type dopant 472 while the first region 404 is masked, as shown in FIG. 18.

The structure shown in FIG. 18 illustrates that the single conductive layer 468, after implanting the Fermi-pinning material 464, forms a first gate material 422 in the second region 406 and a second gate material 428 in the first region 404. Likewise, the single insulating layer 466 forms a first gate dielectric material 420 in the second region 406 and a second gate dielectric material comprising a first insulating layer 450 and a second insulating layer 452 in the first region 404. The device 400 is then patterned and the manufacturing process is continued to produce the novel CMOS device shown in a cross-sectional view in FIG. 10.

The embodiment shown in FIGS. 17 and 18 is advantageous in that the number of lithography masks required to manufacture the device 400 is further reduced.

Advantages of embodiments of the invention include providing methods of fabricating a CMOS device 100, 200, 300, 400 and structures thereof wherein the PMOS transistor 136, 236 and the NMOS transistor 138, 238 have a substantially symmetric $V_t$. For example, $V_{tn}$ may be about +0.2 to +5 V, and $V_{tp}$ may be the substantially the same negative value, e.g., about −0.2 to −5 V. The threshold voltages $V_t$ may alternatively comprise other voltage levels, for example. Work function symmetry is achieved by using a different dielectric material GD1 and GD2 for the PMOS transistor 136/236 and the NMOS transistor 138/238, respectively. The threshold voltage $V_t$ is decreased compared to prior art CMOS devices, and the flat band voltage is easier to tune. Embodiments of the invention may utilize high-k dielectric materials as the gate dielectric GD1/GD2, using polysilicon, metal or FUSI gate electrodes G1/G2. The metal gate electrodes G1/G2 may comprise either single metal or dual-work function metals, e.g., the gate electrode G1/G2 for the PMOS and NMOS transistors may be the same material or different materials. In one embodiment, wherein the top layer of the gate dielectric of the PMOS transistor 136/236 comprises an aluminum-containing material, the fact that Si—Al pins to p-type and Si—Hf pins to n-type is utilized, to take advantage of the Fermi-pinning effect rather than trying to solve the Fermi-pinning effect or work around it by changing the material of the gate electrode.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    forming a hard mask over a first region of a workpiece;
    forming a first gate dielectric material over the hard mask and a second region of the workpiece;
    forming a first gate material over the first gate dielectric material;
    removing the first gate material, the first gate dielectric material, and the hard mask from over the first region of the workpiece, leaving the first gate material and the first gate dielectric material residing over the second region of the workpiece;
    forming a second gate dielectric material over the first region of the workpiece and over the first gate material in the second region of the workpiece, the second gate dielectric material comprising a different material than the first gate dielectric material;

forming a second gate material over the second gate dielectric material;

removing the second gate material and the second gate dielectric material from over the second region of the workpiece, leaving the second gate material and the second gate dielectric material over the first region of the workpiece; and patterning the first gate material, the second gate material, the first gate dielectric material and the second gate dielectric material, wherein the first gate material comprises a first gate of a first transistor, wherein the first gate dielectric material comprises a first gate dielectric of the first transistor, wherein the second gate material comprises a second gate of a second transistor, and wherein the second gate dielectric material comprises a second gate dielectric of the second transistor.

2. The method according to claim 1, wherein forming the hard mask comprises:

depositing a first insulating layer over the workpiece;

depositing a second insulating layer over the first insulating layer;

depositing a photoresist over the second insulating layer;

removing the photoresist from over the second region of the workpiece;

removing the second insulating layer and the first insulating layer from the second region using the photoresist as a mask; and removing the photoresist.

3. The method according to claim 2, wherein depositing the first insulating layer comprises depositing about 300 Angstroms of tetraethoxysilate (TEOS), and wherein depositing the second insulating layer comprises depositing about 1500 Angstroms of silicon nitride.

4. The method according to claim 1, wherein the workpiece has a top surface, wherein forming the second gate dielectric material and forming the second gate material comprise depositing the second gate dielectric material over an entire top surface of the workpiece, depositing the second gate material over the second gate dielectric material, and removing the second gate dielectric material and the second gate material from over the second region of the workpiece, and wherein forming the first gate dielectric material and forming the first gate material comprise depositing the first gate dielectric material over the second region of the workpiece and over the second gate material over the first region of the workpiece, depositing the first gate material over the first gate dielectric material, and removing the first gate material and the first gate dielectric material from the first region of the workpiece.

5. The method according to claim 4, wherein forming the second gate dielectric material and forming the second gate material comprise forming the hard mask over the second gate material, using the hard mask to mask the second gate material and the second gate dielectric material over the first region of the workpiece while the second gate material and the second gate dielectric material are removed from over the second region of the workpiece, and removing the hard mask.

6. The method according to claim 1, wherein the workpiece has a top surface, wherein forming the first gate dielectric material and forming the second gate dielectric material comprise depositing an insulating layer over an entire top surface of the workpiece, wherein forming the first gate material and forming the second gate material comprise depositing a conductive layer over the insulating layer, further comprising:

implanting a Fermi-pinning material into at least the conductive layer over the first region of the workpiece.

7. The method according to claim 6, wherein implanting the Fermi-pinning material further comprises implanting the Fermi-pinning material into at least a top portion of the insulating layer.

8. The method according to claim 6, wherein implanting the Fermi-pinning material comprises implanting aluminum.

9. The method according to claim 1, further comprising forming a first source and a first drain proximate the first gate and first gate dielectric of the first transistor, and forming a second source and a second drain proximate the second drain and the second gate dielectric of the second transistor.

10. The method according to claim 9, further comprising forming a silicide layer over the first source, the first drain, or the first gate of the first transistor, or over the second source, the second drain, or the second gate of the second transistor.

11. The method according to claim 9, wherein the first region of the workpiece is proximate the second region of the workpiece, wherein the semiconductor device comprises a complementary metal oxide semiconductor (CMOS) device, wherein the first transistor comprises an n channel metal oxide semiconductor transistor (NMOS) device, and wherein the second transistor comprises a p channel metal oxide semiconductor transistor (PMOS) device, wherein the first transistor and the second transistor comprise substantially symmetric threshold voltages $V_t$.

12. The method according to claim 11, further comprising lightly doping the first region with an N dopant and lightly doping the second region with a P dopant, wherein forming the first source and the first drain of the first transistor comprise implanting N dopants into the second region of the workpiece, and wherein forming the second source and the second drain of the second transistor comprise implanting P dopants into the first region of the workpiece.

13. The method according to claim 1, wherein forming the first gate dielectric material comprises forming a Fermi-pinning material, and wherein forming the second gate dielectric comprises forming a non-Fermi-pinning material.

14. The method according to claim 13, wherein forming the Fermi-pinning material comprises forming about 10 to 60 Angstroms of an aluminum-containing layer, wherein the aluminum-containing layer abuts the first gate or the second gate.

15. The method according to claim 14, wherein forming the Fermi-pinning material comprises depositing the aluminum-containing layer.

16. The method according to claim 14, wherein forming the Fermi-pinning material comprises implanting aluminum.

17. The method according to claim 1, wherein forming the second gate dielectric material comprises:

forming a first insulating layer over the second region of the workpiece; and forming a second insulating layer over the first insulating layer.

18. The method according to claim 17, wherein the first transistor comprises an NMOS transistor and the second transistor comprises a PMOS transistor, wherein forming the first insulating layer comprises depositing a high-k dielectric material, wherein forming the second insulating layer comprises forming an aluminum-containing material, and wherein forming the first gate material comprises depositing the first gate material over and abutting the second insulating layer.

19. The method according to claim 18, wherein forming the second insulating layer comprises forming $Al_xO_y$ or $Al_xO_yN_{1-x-y}$.

20. The method according to claim 18, wherein forming the second insulating layer comprises forming the second insulating layer having a thickness of about 10 to 60 Angstroms.

21. The method according to claim 18, wherein forming the first insulating layer comprises depositing $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $SiO_2$, or combinations thereof.

22. The method according to claim 1, wherein forming the first gate dielectric material and forming the second gate dielectric material comprise depositing $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $SiO_2$, or combinations thereof.

23. The method according to claim 1, wherein forming the first gate material and forming the second gate material comprise depositing a semiconductor material or a metal.

24. The method according to claim 23, wherein forming the first gate material and forming the second gate material comprise forming polysilicon, TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, (borides, phosphides, or antimonides of Ti), Hf, Zr, TiAlN, Mo, MoN, ZrSiN, ZrN, HfN, HfSiN, WN, Ni, Pr, VN, TiW, a fully silicided gate material (FUSI), or combinations thereof.

25. The method according to claim 23, wherein the first transistor comprises an NMOS transistor and the second transistor comprises a PMOS transistor, wherein the forming the first gate material and forming the second gate material comprise depositing polysilicon, further comprising:
doping the first gate with an N dopant, after forming the first gate material; and
doping the second gate with a P dopant, after forming the second gate material.

26. A method of manufacturing a semiconductor device, the method comprising:
forming a first gate dielectric material over a second region of a workpiece;
forming a first gate material over the first gate dielectric material;
forming a second gate dielectric material over a first region of the workpiece, the second gate dielectric material comprising a different material than the first gate dielectric material;
forming a second gate material over the second gate dielectric material forming a hard mask over the second gate material in the first region of the workpiece;
removing the second gate material and the second gate dielectric material from the second region of the workpiece;
removing the hard mask; and
patterning the first gate material, the second gate material, the first gate dielectric material and the second gate dielectric material, wherein the first gate material comprises a first gate of a first transistor, wherein the first gate dielectric material comprises a first gate dielectric of the first transistor, wherein the second gate material comprises a second gate of a second transistor, and wherein the second gate dielectric material comprises a second gate dielectric of the second transistor, wherein forming the hard mask comprises depositing about 300 Angstroms of tetraethoxysilate (TEOS).

27. The method according to claim 26, wherein removing the first gate material and the first gate dielectric material from the first region of the workpiece comprise depositing a photoresist over the first gate material, removing the photoresist from over the first region of the workpiece, removing the first gate material and the first gate dielectric material from the first region using the photoresist as a mask, and removing the photoresist.

* * * * *